United States Patent [19]
Havens et al.

[11] Patent Number: 5,888,850
[45] Date of Patent: Mar. 30, 1999

[54] METHOD FOR PROVIDING A PROTECTIVE COATING AND ELECTRONIC PACKAGE UTILIZING SAME

[75] Inventors: Ross Downey Havens, Endicott; Robert Maynard Japp, Vestal; Jeffrey Alan Knight, Endwell; Mark David Poliks, Vestal, all of N.Y.; Anne M. Quinn, deceased, late of Kirkwood, N.Y., by Ronald D. Quinn, executor

[73] Assignee: International Business Machines Corporation, Armonk, N.Y.

[21] Appl. No.: 939,302

[22] Filed: Sep. 29, 1997

[51] Int. Cl.$^6$ .......................... H01L 21/44; H01L 21/48; H01L 21/50
[52] U.S. Cl. ........................................ 438/127; 438/106
[58] Field of Search ..................... 438/127, 106

[56] References Cited

U.S. PATENT DOCUMENTS

| | | |
|---|---|---|
| 2,720,617 | 10/1955 | Sardella . |
| 4,351,101 | 9/1982 | Young . |
| 4,754,009 | 6/1988 | Squire . |
| 4,889,960 | 12/1989 | Butt . |
| 4,921,723 | 5/1990 | Nichols et al. . |
| 5,045,151 | 9/1991 | Edell ........................................ 438/127 |
| 5,137,780 | 8/1992 | Nichols et al. . |
| 5,137,846 | 8/1992 | Machuga et al. ........................ 438/127 |
| 5,147,822 | 9/1992 | Yamazaki et al. ...................... 438/127 |
| 5,166,773 | 11/1992 | Temple et al. . |
| 5,209,390 | 5/1993 | Temple et al. . |
| 5,289,346 | 2/1994 | Carey et al. ............................. 438/127 |
| 5,308,797 | 5/1994 | Kee ......................................... 438/127 |
| 5,436,203 | 7/1995 | Lin . |
| 5,474,957 | 12/1995 | Urushima . |
| 5,496,775 | 3/1996 | Brooks . |
| 5,733,802 | 3/1998 | Inoue et al. ............................. 438/127 |

OTHER PUBLICATIONS

"The Preparation And Properties Of A New Family Of Amorphous Fluoropolymers: Teflon® AF", by Paul R. Resnick.

*Primary Examiner*—Kevin M. Picardat
*Assistant Examiner*—Deven Collins
*Attorney, Agent, or Firm*—Lawrence R. Fraley

[57] ABSTRACT

The present invention is a method of providing a protective covering on an electronic package including a first circuitized substrate, a semiconductor chip positioned on and electrically coupled to the first substrate, and a plurality of conductors also on the substrate for electrically connecting the substrate to an external circuitized substrate. In one version, the method comprises covering substantially all of the external surfaces of the substrate, the semiconductor chip and a portion of the plurality of conductors with a protective covering from immersion in a dielectric solution (e.g., TEFLON AF). The coatings can also be applied by brushing, spraying, or chemical vapor deposition. In an alternative embodiment, all of the external surfaces, including all of the conductors, are coated with the protective covering (e.g., to facilitate package shipment or other handling). The resulting electronic packages are also described herein.

30 Claims, 8 Drawing Sheets

METHOD FOR PROVIDING A PROTECTIVE COATING AND ELECTRONIC PACKAGE UTILIZING SAME

FIELD OF THE INVENTION

This invention relates to a protective covering for an electronic package and, more particularly, to a dielectric protective covering for an electronic package comprising a semiconductor chip, a substrate, and conductors which may be used within an information handling system (computer).

BACKGROUND OF THE INVENTION

There have been previous attempts to apply coatings onto electronic packages, including attempts to encapsulate chips and conductors with the main emphasis of providing mechanical strength to the conductors. However, such efforts have not typically solved problems associated with moisture sensitivity.

In electronic chip carrier packages, moisture can cause various problems such as delamination, corrosion, formation of plated fiber shorts, chip cracking and debonding. This may result in yield loss and/or functional failure during assembly and reliability testing. Organic packages are particularly susceptible to moisture due to the hydrophilic nature of resins such as epoxies and polyimides when exposed to moisture, and are susceptible to the brittleness of glass reinforcement interfaces.

U.S. Pat. No. 5,474,957 to Urushima shows a process for building/assembling a chip onto a flexible film member. The assembly process involves using a piece of resin, to encapsulate the wire bond leads and act to hold the chip to the film. While the purpose of this resin is in part to prevent corrosion/oxidation, and to mechanically protect the wire bond leads, it is used in an entirely different location and with a completely different purpose than the present invention. U.S. Pat. No. 5,474,957 describes the use of a wire bond encapsulant which is applied only to the wire bond area. The present invention, on the other hand, involves using a protective coating over substantially the entire assembled package including, chip, wires (if used), or solder joints and the chip carrier.

U.S. Pat. No. 5,436,203 to Lin covers the concept of building an EMI shielded chip carrier package by shielding the chip and wire bonds. The bottom is shielded with a buried power plane or reference plane, and the top is shielded with a conductive encapsulate. The two shielding layers are electrically connected via plated thru holes. The chip and wire bonds are first covered with a non conductive encapsulant. Lin is different from the present invention for substantially the same reasons as Urushima above.

U.S. Pat. No. 5,496,775 to Brooks discloses using stacked and bonded metal balls as the electrical connection points. The chip is enclosed in an encapsulation material. The primary function of the encapsulant material appears to be to provide mechanical support for the chip and ball towers. The encapsulation is performed in two steps. First, a layer of encapsulant is formed within a mold or cavity. Next, the ball stacked chip is placed in the cavity and additional encapsulant is flooded into the mold and around the stacked ball towers. These two encapsulant layers form part of the chip package. The primary subject covered by Brooks appears to be the concept of using stacked metal balls as electrical leads, with the primary purpose of the encapsulant layer being to support and strengthen these leads.

U. S. Pat. No. 4,351,101 to Young shows a method of making connection to CCD (charged coupled device) chips. The method describes how metal pads are allowed to sink through a layer of uncured epoxy, via gravity, as an improvement over the previous method which involved hours of lapping (mechanical sanding).

U.S. Pat. No. 2,720,617 to Sardella covers a method of making a two-part case for early transistor packages, (circa 1955). The case consists of two pieces of TEFLON, (or other fluorocarbons), which are mechanically machined to form a hollow tube and a plug, both threaded. TEFLON is a trademark of E. I. du Pont de Nemours and Co., Inc. The transistor is placed into the tube, the tube is filled with epoxy encapsulant and the plug is screwed into the tube. The transistors are covered for improved resistance to vibration, moisture and mechanical damage.

The glasses used in electronic packaging of semiconductor and other electronic devices may successfully provide hermetic packaging; however, such glasses may create problems. Conventional sealing glasses are usually brittle and glass sealed semiconductor packages require special care in handling both during and subsequent to processing. This is necessary to avoid fracture of the glass and resulting loss of package hermeticity. The methods of applying the glass to the components to be sealed are also generally somewhat tedious and costly. One known method of applying the glass is to mix finely powdered glass with a suitable vehicle. The mixture is then silk screened in place upon the components. Next, the glass applied component is fired to coalesce the individual glass particles into a continuous glass coating in the areas previously silk screened. At the same time, any residue from the vehicle used during silk screening is driven off.

The present invention comprises a product (electronic package) and a method for making said product, that contains a semiconductor chip wherein substantially the entire electronic package is encapsulated with a solution which forms a protective coating sufficient to protect the electronic package from exposure to moisture and other adverse environmental conditions.

SUMMARY OF THE INVENTION

It is an object of the present invention to enhance the art of information handling systems. More particularly, it is an object of the present invention to provide an improved method for mass producing electronic packages. Further, it is an object of the present invention to provide an improved electronic package product.

In one aspect of the invention, there is provided a method of providing a protective covering on an electronic package including a substrate, a semiconductor chip positioned and electrically coupled to the substrate, and a plurality of conductors on the substrate for electrically connecting the substrate to an external substrate. The method comprises covering substantially all of the external surfaces of the substrate, the semiconductor chip and a portion of the plurality of conductors with a protective covering.

In accordance with another aspect of the invention, there is provided a method of providing a protective covering on an electronic package including a substrate, a semiconductor chip positioned on and electrically coupled to the substrate, and a plurality of conductors on the substrate for electrically coupling the substrate to an external substrate. In this aspect of the invention, substantially all of the external surfaces of the substrate, the semiconductor chip and the plurality of conductors are initially covered with the protective covering. Thereafter, a portion of the covering is removed from a portion of the external surfaces of the plurality of conductors.

According to another aspect of the invention, there is provided an electronic package comprising a first substrate, a semiconductor chip positioned on a first surface of the first substrate and electrically coupled to the substrate, a plurality of conductors located on a second surface of the first substrate for electrically coupling the first substrate to an external substrate, and a dielectric protective covering, substantially covering all of the external surfaces of the electronic package, except for a portion of the plurality of conductors.

According to yet another aspect of the invention, there is provided an electronic package comprising a substrate having first and second surfaces, a semiconductor chip positioned on the first surface of the substrate and electrically coupled to the substrate, a plurality of conductors located on the second surface of the substrate for electrically coupling the substrate to an external substrate, and a dielectric protective covering, substantially covering the entire external surfaces of the electronic package.

BRIEF DESCRIPTION OF THE DRAWINGS

FIG. 1A represents an alternative embodiment of the process wherein the tape acts both as a suspending mechanism and as a cover layer. FIG. 1B shows an enlarged view of a portion of FIG. 1.

FIG. 2A shows an enlarged view of a portion of FIG. 2.

FIG. 3A shows an enlarged view of a portion of FIG. 3.

FIG. 4A shows an enlarged view of a portion of FIG. 4.

FIG. 6A shows an enlarged view of a portion of FIG. 6.

DETAILED DESCRIPTION OF THE PREFERRED EMBODIMENTS

This invention largely solves the moisture sensitivity problem associated with electronic packages (e.g. chip carriers) by covering substantially all of the external surfaces of the electronic package, with the exception of a portion of the conductors that are required for electrically coupling to an external substrate, with an essentially hermetic covering which is highly hydrophobic. Before sealing with the protective covering, the assembled carrier is preferably heated which removes substantially all of the moisture therein. The protective covering then seals all the surfaces to which it is exposed, forming a barrier which greatly retards future moisture absorption. The reduced level of moisture improves product yields and reliability thru the final assembly and testing processes.

In one embodiment, all of the package, including all of the external conductor surfaces, are covered (e.g., to facilitate shipment). In another embodiment, portions of the external conductor surfaces are exposed, thus enabling immediate subsequent processing (e.g., solder reflow).

Similar numbers are used in different FIGS. to indicate similar elements of the invention.

Figure 1:
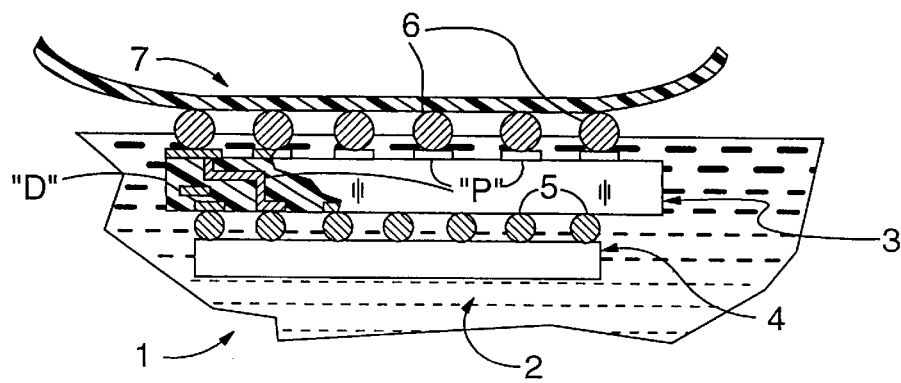
FIGS. 1, 1A, and 1B show an immersion of an electronic package into a protective covering solution using tape as a suspending mechanism, according to one embodiment of the invention.
Figure 1B:
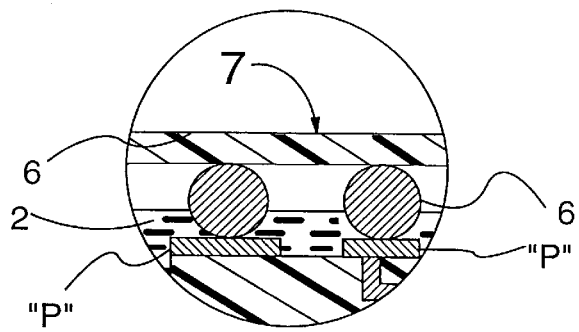
Figure 1A:
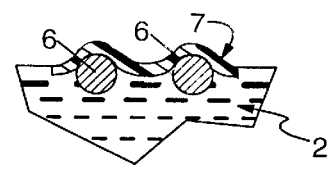

In the embodiment shown in FIG. 1, electronic package 1 is immersed in a solution 2 in order to apply a protective covering thereto. Electronic package 1 comprises a circuitized substrate 3 (e.g., a dielectric structure having one/more internal and/or external conductive planes "P" and one/more dielectric layers "D"), semiconductor chip 4, a plurality of conductors 5 electrically coupling semiconductor chip 4 to substrate 3, and a plurality of conductors 6 for electrically coupling substrate 3 to an external substrate (e.g., a printed circuit board). In one embodiment, conductors 5 and 6 are preferably solder balls which in turn may be of solder compositions (e.g., 90:10 lead:tin, 63:37 lead:tin, etc.) known in the electronic packaging art. Also, these may be of different sizes (e.g., conductors 5 may be of spherical shape having a first diameter while conductors 6, also spherical, may be of larger diameters. These may also be of different melting points (e.g., those conductors 6 possessing a relatively lower melting point than those coupling the chip to substrate 3). In FIG. 1, a suspending mechanism, such as a dielectric tape 7, is used to engage conductors 6 and to hold electronic package 1 in solution 2 at the desired level. Tape 7 can act as a suspending mechanism as shown in FIG. 1, as a cover layer (described below), or as both a suspending mechanism and as a cover layer as shown in FIG. 1A. FIG. 1B shows an enlarged portion of electronic package 1 being immersed in solution 2, using tape 7 as the suspending mechanism.

Tape 7 is preferably TEFLON with a thickness of 2–4 mils (0.002–0.004 inch). Conductors 6 are preferably depressed partly into tape 7 prior to suspension of electronic package 1 in solution 2. In this manner, solution 2 is applied to all of the external surfaces of electronic package 1, except for the portion of conductors 6 suspended above the upper surface of the solution.

Tape 7 may also act as a cover layer (see below), thereby preventing solution 2 from contacting a predetermined portion of conductors 6. If conductors 6 are solder balls (e.g., 63:37 lead:tin), then tape 7 could conform to predetermined portions of the outer surfaces of the solder balls, thereby acting as a seal when electronic package 1 is immersed in solution 2. The solder balls would be depressed into tape 7, as is seen in FIG. 1A.

In the embodiment of FIG. 1, solution 2 can be agitated ultrasonically while electronic package 1 is immersed therein. For achieving a desired thickness for the eventual protective covering, it is possible to immerse electronic package 1 a plurality of times (e.g., providing a thickness of 0.001 inch in one embodiment was attainable using a total of four immersions) in a resin/solvent solution containing approximately 10% solids by weight (see more below).

For ultrasonic application, a frequency in the kilohertz range (e.g., about 55 KHz) is preferred. The device used to provide this may be an ultrasonic bath/cleaner (not shown), of which there are known types in the art.

Protective covering solution 2 described herein may be any dielectric material that will provide a good hydrophobic barrier for electronic package 1. Some common solution materials include TEFLON and fluorinated thermosets, which can be applied using one or more of the processes defined herein.

The preferred TEFLON described for use as solution 2 is more commonly called TEFLON AF, a product of E.I. du Pont de Nemours & Co. Inc. TEFLON AF is a family of amorphous fluoropolymers with glass transition temperatures as high as 300 degrees Celsius based on bis-2,2-trifluoromethyl-4,5-difluoro-1,3-dioxole, and which has unusual properties. The family retains the superior electrical, chemical resistant and thermal properties associated with fluoropolymers. In addition, these polymers have high optical clarity, limited solubility in some commercially available perfluorinated ethers and improved physical properties below the glass transition temperatures. TEFLON AF polymers may be either solution cast into clear micron thin films or melt processed into a variety of forms. TEFLON AF has a very low dielectric constant (1.89–1.93) which decreases with increasing temperature. It also has a constant volume coefficient of thermal expansion below the glass transition temperatures thereof. TEFLON AF also has a high thermal stability (zero weight loss at 260 degrees Celsius). It can be fabricated by spin casting and solution or spray coating from polymer solutions. Using these techniques, it has been possible to obtain clear, substantially pin hole-free film coatings less than one micron thick.

In addition to package immersion into a solution 2, other methods of applying the protective covering solution to the electronic package are possible, including spraying or chemical vapor deposition. The coating process can also be completed by brushing. Brushing can be advantageous in that it can allow thicker layers to be deposited in one pass. While TEFLON AF is limited to approximately 10–15% solids, if so applied, solutions of other thermosetting resins such as AROCY F-40 available from Ciba-Geigy can be brushed on at up to 50% by weight solids.

As stated, the protective coating can also be applied by spraying. A suitable solvent/resin solution may be sprayed onto the electronic package, dried, and then heat cured (if necessary). One particular advantage of using TEFLON AF is that it requires no curing step.

Chemical vapor deposition (CVD) is accomplished by processing the electronic package thru a standard four-stage CVD apparatus, known in the art. The actual coating takes place in the deposition chamber(s) at approximately 0.001 Torr pressure and at 25 degrees Celsius (C.). Examples of solutions which can be satisfactorily applied using such deposition include fluorinated parylene and standard parylene-C type coatings. (Parylene is a known dielectric material in the electronic packaging art.)

As stated above, curing of the applied coating may be necessary, depending on the material used. Curing offers reduced skin effect and minimal surface coating distortion (see more below). Infrared dry/cure is a preferred method. TEFLON AF can be air dried at room temperature if it is coated from FC-77 fluorocarbon solvent, a known material. Slightly elevated temperatures, e.g., 100 degrees C. for one hour, can be used to accelerate the drying of TEFLON AF. AROCY F-40, with zinc octoate catalyst, should first be dried (typically 20 minutes at 100 degrees C.) and then heated to approximately 280 degrees C. for one hour to achieve full cure. Obviously, prior to heating to this high temperature, any tape should be removed from the electronic package.

Skin effect occurs when the solution dries at too high a temperature. This causes the outermost portion of the coating to harden before the interior. The outermost layer formed will thus act as a seal before the interior hardens, causing the interior portion of the solution to possibly expand against the sealed (hardened) outer (skin) layer. The result is blistering or voids in the protective covering, thus referred to as skin effect. Significantly, the present process substantially eliminates this occurrence.

Other curing processes may include air drying and convection heating.

Figure 2A:
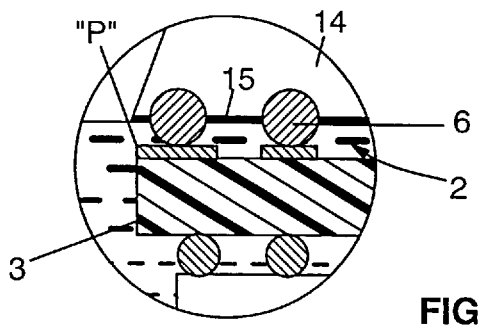
FIGS. 2 and 2A show an immersion of an electronic package into a protective covering solution using a vacuum fixture on a portion of the conductors, according to another embodiment of the invention.
Figure 2:
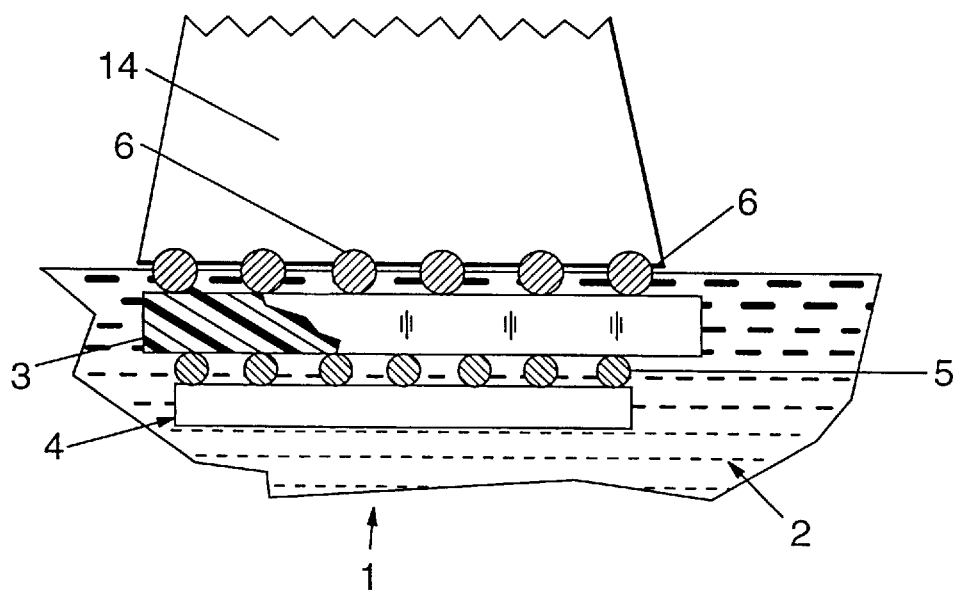

In the embodiment shown in FIG. 2, electronic package 1 is immersed into solution 2 in order to apply a protective covering thereto. In FIG. 2, vacuum fixture 14 is used to engage a portion of conductors 6 and to provide a substantially solution-proof seal as the electronic package is immersed. The solution-proof seal keeps solution 2 from contacting those portions of conductors 6 that are engaged by vacuum fixture 14. In this manner, solution 2 is applied to all of the external surfaces of electronic package 1, except for the portion of conductors 6 surrounded (sealed) by vacuum fixture 14. FIG. 2A illustrates this form of securement in greater detail.

Vacuum fixture 14 typically includes a pliable material 15, such as rubber or vinyl, to engage and conform to portions of the conductors 6. The vacuum fixture 14 of FIG. 2 is intended to engage the portions of the conductors 6 that are to remain free of protective covering during the application process. This engagement forms a seal from which substantially all of the air is removed by vacuum fixture 14.

After solution 2 is applied to electronic package 1 through one or more immersions, vacuum fixture 14 is removed, thereby forming electronic package 1 with a dielectric and substantially hydrophobic protective covering over substantially all of the external surfaces of electronic package 1, except for the portion of conductors 6 that were engaged by the vacuum fixture. Drying and/or curing of the external protective coating material may now occur, depending on the solution composition used.

The vacuum fixture 14 may also be used when applying any of the solutions to electronic package 1 using one or more of the other various methods disclosed herein. These may include immersion of electronic package 1 into solution 2 with ultrasonic agitation of solution 2, spraying solution 2 onto electronic package 1, brushing solution 2 onto electronic package 1, and chemical vapor deposition of fluorinated parylenes. If the package is to be immersed more than once in the solution, then vacuum fixture 14 should remain in place during all such applications.

Figure 3A:
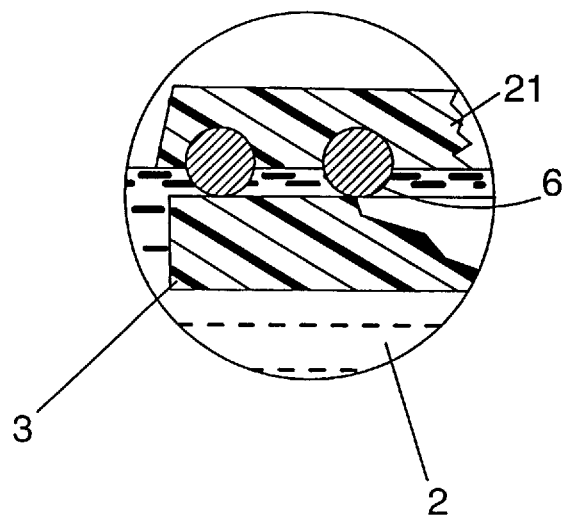
FIGS. 3 and 3A show an immersion of an electronic package into a protective covering solution using a cover layer on a portion of the conductors, according to another embodiment of the invention.
Figure 3:
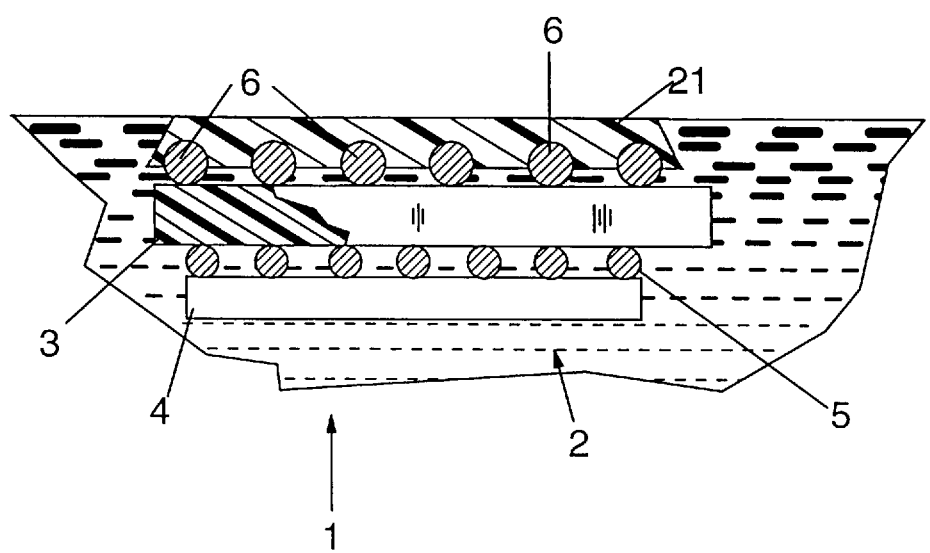

In the embodiment shown in FIG. 3, electronic package 1 is immersed into solution 2 in order to apply a protective covering thereto. In FIG. 3, however, a cover layer 21 is used to cover a portion of conductors 6 and to provide a substantially solution-proof seal of portions of the conductors as the package is immersed. In this manner, solution 2 is applied to all of the external surfaces of electronic package 1, except for the portion of conductors 6 being sealed by cover layer 21. FIG. 3A is an enlarged view of package 1 being immersed, illustrating the proper positioning of layer 21 in greater detail.

Cover layer 21 is preferably applied using a masking operation. Some examples of acceptable materials for cover layer 21 include wax, conformal tape (where conductors 6 are depressed into the conformal tape), and photoresist. Typically, the portions of conductors to be used for electrically coupling substrate 3 to an external substrate (e.g., circuit board) are those areas protected by cover layer 21 during the application of solution 2. In a preferred embodiment, approximately fifty percent of the external surface area of each conductor (preferably a solder ball) was covered (sealed).

After solution 2 is applied to electronic package 1, cover layer 21 is removed, thereby forming electronic package 1 with a dielectric and substantially hydrophobic protective covering over substantially all of the external surfaces of the package, except for those portions of conductors 6 that were covered by the cover layer. This package is now ready for shipment and/or subsequent connection (e.g., using solder reflow) to an awaiting circuitized substrate.

Cover layer 21 may also be applied using one or more of the various disclosed methods cited hereinabove.

If the solution in FIG. 3 is to be applied more than once to package 1, then cover layer 21 should remain in place for all solution immersions. In one embodiment, package 1 was immersed four times, resulting in a satisfactory protective covering thickness of about 0.001 inch.

Figure 4A:
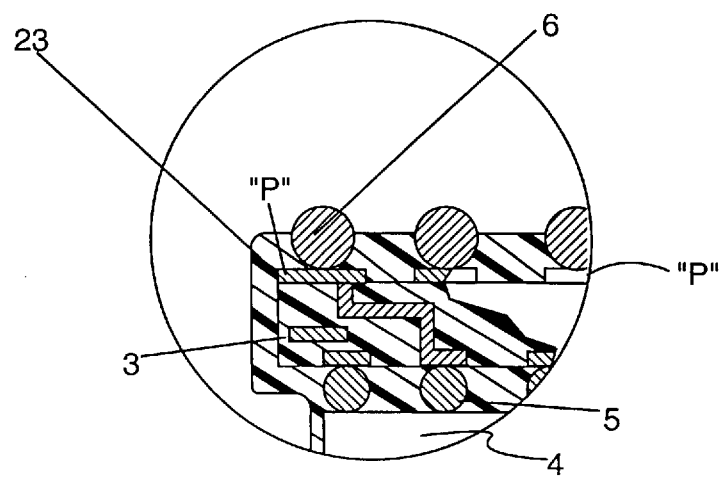
FIGS. 4 and 4A show substantially all of an electronic package covered with a protective covering except for a portion of the conductors, according to another embodiment of the invention.
Figure 4:
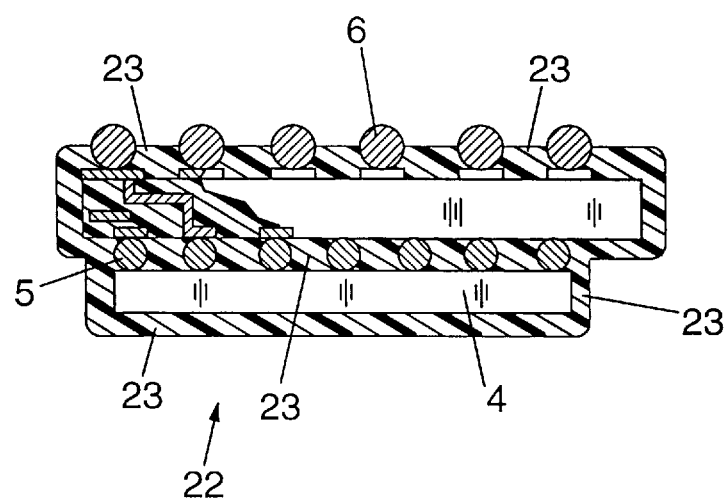

In the embodiment shown in FIG. 4, electronic package assembly 22 is shown with protective covering 23 applied to substantially all of the external surfaces of electronic package 22, except for a portion of the plurality of conductors 6. This resulting structure is, understandably, attainable using any of the processes illustrated in FIGS. 1–3A and described in detail hereinabove. As stated, electronic package assembly 22 can now be assembled (soldered) onto a printed circuit board PCB, using known solder reflow processing. The printed circuit board can then be assembled into an information handling system (e.g., computer) to form a part thereof FIG. 4A shows a portion of FIG. 4 in an enlarged view.

Figure 5:
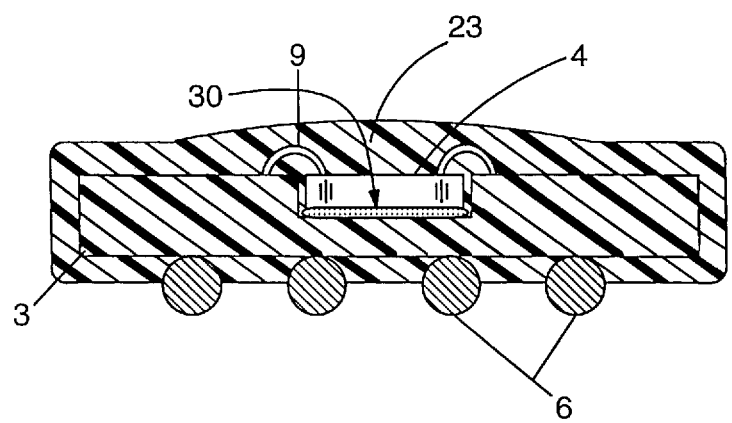
FIG. 5 shows substantially all of an electronic package covered with a protective covering except for a portion of the conductors. A semiconductor chip is wire bonded to the package's substrate.

In the embodiment shown in FIG. 5, the electronic package assembly 29 is shown with a protective covering 23 applied to substantially all of the external surfaces of the electronic package, again except for a portion of the conductors 6. In FIG. 5, however, the semiconductor chip 4 is wire-bonded (using wiring 9) to the substrate 3, after having been positioned within a recess 30 in substrate 3. It is understood that these wires 9 electrically couple chip contact sites (not shown) to corresponding conductive pads (also not shown) of the circuitry on the substrate's upper surface. As seen in FIG. 1, for example, these pads are then coupled (e.g., using plated through holes) to corresponding pads on the substrate's lower surface having the conductors 6 thereon.

Figure 6A:
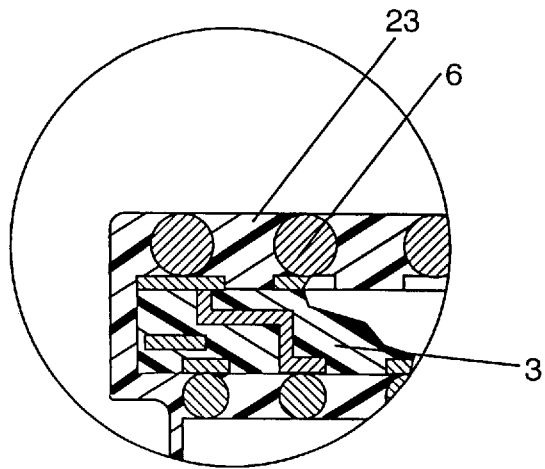
FIGS. 6 and 6A show substantially all of an electronic package covered with a protective covering, according to another embodiment of the invention.
Figure 6:
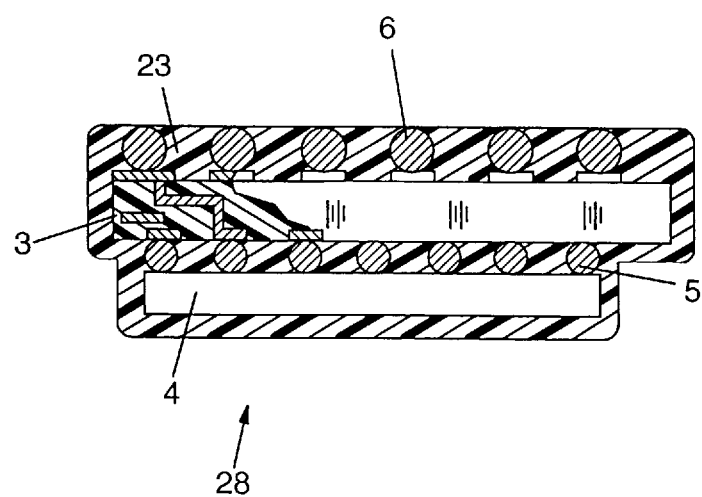

In the embodiment shown in FIG. 6, the electronic package assembly 28 is shown with a protective covering 23 applied to substantially all of the external surfaces of the package. FIG. 6A shows a portion of FIG. 6 in an enlarged view. Chip 4 in FIG. 6 is electrically coupled to substrate 3 with conductive solder elements 5. Such a complete covering is attained by totally immersing the package into solution without protecting selected portions of conductors 6, as occurred in FIGS. 1–3A. A suitable holder can be used for this.

Figure 7:
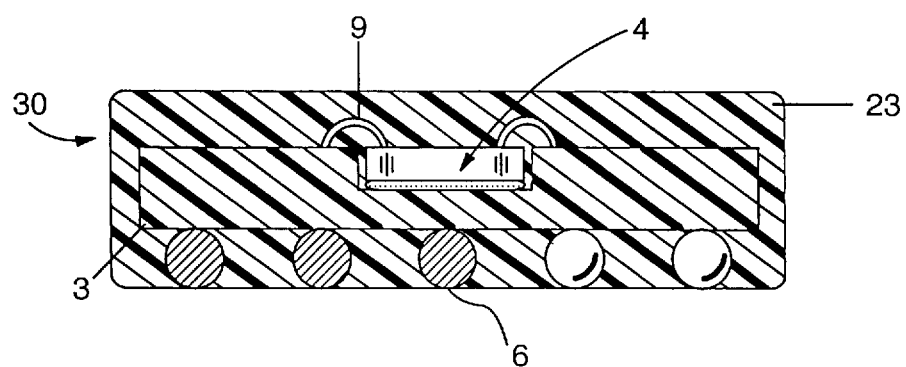
FIG. 7 also shows substantially all of an electronic package covered with a protective covering. A semiconductor chip is wire bonded to the package's substrate.

In the embodiment shown in FIG. 7, the electronic package assembly 30 is shown with a protective covering 23 applied to substantially all of the external surfaces of the electronic package 30, again including all surfaces of conductors 6. In FIG. 7, as in FIG. 5, the semiconductor chip 4 is wire-bonded to the substrate using wiring (e.g., gold) 9.

In the embodiments of the invention shown in FIGS. 6 and 7, protective covering 23 is applied to all of the external surfaces of the package by any of the methods described above,(e.g., such as immersing electronic package 1 without cover layer 21 in solution 2). Thereafter, selected portions of the protective covering 23 can be removed from at least those portions of the plurality of conductors 6 that are required to electrically couple the substrate with an external substrate. In the meantime, shipping and other handling of the fully protected package assembly is readily possible.

To remove selected portions of the protective covering, a photoresist may be used. The photoresist may be applied to all portions of the protective covering 23, except to those selected portions that are to be removed. Then a flourocarbon solvent, such as the aforementioned FC-77 solvent, may be applied to wash away those portions of covering 23 not protected by the photoresist. Thereafter, the photoresist may or may not be removed from the protective covering 23 before eventual product utilization.

Since the topography of the underlying solder balls 6 may be somewhat uneven, a liquid- or electro-deposited photoresist is preferably used, providing a conformal-type covering on the underlying coating located over balls 6. Exposure to colluminated light will then image the photoresist, following which imaged portions may be removed.

Figure 9:
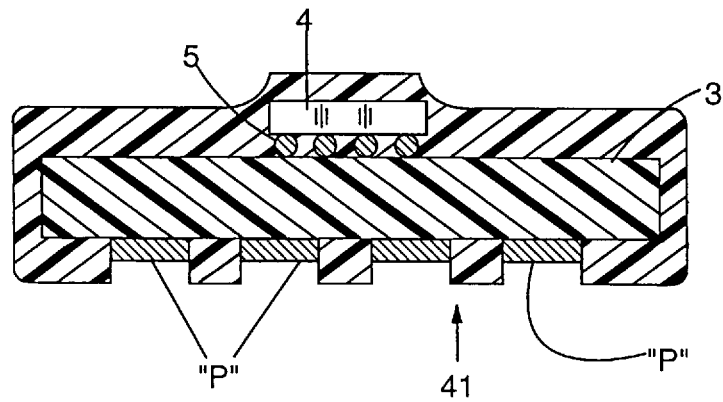
FIG. 9 shows substantially all of an electronic package covered with a protective covering, except for a plurality of solder ball bonding pads.
Figure 8:
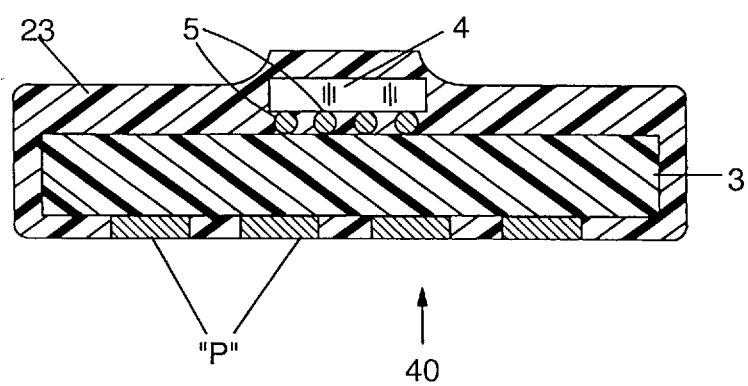
FIG. 8 shows substantially all of an electronic package covered with a protective covering. Solder ball bonding pads are used instead of solder balls, which allows for later installation of solder balls.

It should also be noted that the solder balls 6 need not be applied to the package's substrate before applying the protective covering. In FIG. 8, the electronic package is entirely coated with solution and cured. The protective covering is then selectively removed (as described above) so as to expose underlying bonding pads "P" (see also FIGS. 1 and 1A) for subsequent solder ball 6 positioning thereon and coupling thereto. The surrounding coating thus facilitates such ball placement by proving a "template" over the exposed pads. The result is seen in FIG. 9.

Alternatively, a mask may be positioned over the solder balls or solder ball bonding pads and the unwanted dielectric removed by exposure to a liquid or air-carried abrasive stream aimed through the mask's holes. Laser ablation may be used to remove the unwanted portions of protective covering 23. Solder balls 6 may also be bonded using one or more known soldering techniques. For example, the solder balls may be reflowed while located atop the conductors "P".

The substrates 3 as mentioned above are typically made from known materials such as epoxy resin reinforced with fiberglass (also known as "FR4" in the packaging industry), TEFLON, and ceramic. The conductors 5 and 6, as mentioned above, are preferably of known solder conducting material, the most preferred being those comprised of lead and tin alloys.

As further stated above, the conductors 5 that electrically couple the semiconductor chip 4 to the substrate 3 may be of a higher melting point solder material than the conductors 6 used to electrically couple substrate 3 to an external substrate. This is an important feature because, by controlling the reflow temperatures, it allows the solder conductors 6 to reflow when connecting to an external substrate, while at the same time the conductors 5 will be stable, thus keeping intact the required precise electrical coupling between the semiconductor chip 4 and the substrate 3. By way of specific example, the conductors 5 that electrically couple the semiconductor chip 4 to the substrate 3 can be of the aforementioned 90:10 lead-tin solder which has a melting temperature of approximately 310 degrees C., while the conductors 6 used to electrically couple the substrate 3 to an external substrate can be the aforementioned 63:37 lead-tin, which has a lower melting temperature of approximately 180 degrees C.

As stated, the conductors 5 that electrically couple the semiconductor chip 4 to the substrate 3 could also be wires 9 as shown in FIG. 5 and FIG. 7. It is further possible to couple leads from substrate 3 (e.g., projecting cantilever leads such as those from a "flexible" substrate made from a dielectric (e.g., polyimide) thin layer having at least one thin layer of circuitry thereon, of which such projecting leads may form a part) to the chip using known thermocompression (application of heat and pressure) bonding.

Although particular embodiments of the present invention have been shown and described, it will be obvious to those skilled in the art that various changes and modifications may be made therein without departing from the spirit and scope of the present invention.

What is claimed is:

1. A method of providing a protective covering on an electronic package including a substrate, a semiconductor chip positioned on and electrically coupled to said substrate, and a plurality of conductors on said substrate for electrically coupling said substrate to an external substrate, said method comprising covering substantially all of the external surfaces of said substrate, said semiconductor chip and a first portion of the external surface of said conductors with a protective covering, wherein said protective covering on said electronic package is applied by immersing said electronic package in a solution.

2. The method of claim 1, further comprising providing a cover layer on at least a second portion of the external surfaces of said conductors to prevent covering thereof with said protective covering.

3. The method of claim 2, wherein said providing of said cover layer onto said second portions of said conductors is accomplished using a masking operation.

4. The method in claim 3, wherein said masking operation comprises covering said second portions of said conductors with wax, conformal tape, or photoresist.

5. The method of claim 4, further comprising depressing at least said second portions of said conductors into said cover layer prior to said covering of said first portions of said conductors.

6. The method of claim 2, wherein said masking operation further includes using a vacuum fixture to engage said second portions of said conductors to prevent covering thereof with said protective covering.

7. The method of claim 6, wherein said vacuum fixture further comprises engaging said second portions of said conductors with rubber or vinyl material.

8. The method of claim 1, further comprising controlling the depth that said electronic package is immersed in said solution.

9. The method of claim 1, wherein said electronic package is immersed in a solution of TEFLON or a fluorinated thermosetting material.

10. The method of claim 1, wherein said electronic package is immersed in said solution using a tape as a suspending mechanism, said tape engaging said conductors.

11. The method of claim 10, wherein said conductors are depressed into said tape prior to said immersing and remain so depressed during said immersing.

12. The method of claim 1, wherein said solution is agitated ultrasonically when said electronic package is immersed in said solution.

13. The method of claim 1, wherein said electronic package is immersed a plurality of times within said solution.

14. The method of claim 1, further comprising curing said protective covering.

15. The method of claim 14, wherein said curing is accomplished by infrared heating.

16. The method of claim 14, wherein said curing is accomplished by air drying.

17. The method of claim 14, wherein said curing is accomplished by convection heating.

18. A method of providing a protective covering on an electronic package including a substrate having a plurality of conductors for electrically coupling said substrate to an external substrate, a semiconductor chip positioned on and electrically connected to said substrate, said method comprising covering substantially all of the external surfaces of said substrate, said semiconductor chip, and said plurality of conductors with a protective covering, and thereafter removing selected portions of said protective covering from said plurality of conductors.

19. The method of claim 18, further including bonding a conductor element to at least one of said conductors after removal of said portions of said protective covering.

20. The method of claim 18, wherein at least a portion of said protective covering on said electronic package is applied by spraying.

21. The method of claim 18, wherein at least a portion of said protective covering on said electronic package is applied by brushing.

22. The method of claim 18, wherein at least a portion of said protective covering on said electronic package is applied by vapor deposition.

23. The method of claim 18, wherein at least a portion of said protective covering on said electronic package is applied by immersing said electronic package in a solution.

24. The method of claim 23, wherein said solution is TEFLON or a fluorinated thermosetting material.

25. The method of claim 23, wherein said solution is agitated ultrasonically when said electronic package is immersed in said solution.

26. The method in claim 23, wherein said electronic package is immersed a plurality of times within said solution.

27. The method of claim 21, further comprising curing said protective covering.

28. The method of claim 27, wherein said curing is accomplished by infrared heating.

29. The method of claim 27, wherein said curing is accomplished by air drying.

30. The method of claim 27, wherein said curing is accomplished by convection heating.

* * * * *